United States Patent [19]

Roulston et al.

[11] 4,219,780
[45] Aug. 26, 1980

[54] GAIN CONTROLLED AMPLIFIER CIRCUITS

[75] Inventors: John F. Roulston, Kirkliston; George Weeden, Edinburgh, both of Scotland

[73] Assignee: Ferranti Limited, Hollinwood, England

[21] Appl. No.: 3,913

[22] Filed: Jan. 16, 1979

[30] Foreign Application Priority Data

Jan. 18, 1978 [GB] United Kingdom ................. 1928/78

[51] Int. Cl.² .......................................... H03G 3/20
[52] U.S. Cl. ................. 330/52; 330/124 R; 330/132; 330/134; 330/141
[58] Field of Search ................. 330/52, 130, 132, 134, 330/141, 124 R, 281, 295

[56] References Cited

U.S. PATENT DOCUMENTS

| 2,997,668 | 8/1961 | Nolle | 330/52 X |
| 4,061,041 | 12/1977 | Fletcher et al. | 330/52 X |

*Primary Examiner*—James B. Mullins
*Attorney, Agent, or Firm*—Kerkam, Stowell, Kondracki & Clarke

[57] ABSTRACT

Apparatus for controlling the gains of a pair of gain-matched amplifiers includes means for applying to each amplifier a pilot tone in the form of an exponentially-decaying periodic signal. The apparatus also includes three control loops, one for comparing the output of one amplifier with a reference signal to derive an error signal used to control the amplifier gains when the pilot tone is absent, and a second for controlling the gains when the pilot tone is present. The third loop subtracts the outputs of the two amplifiers and uses the resulting error signal in conjunction with one or other of the signals from the other two loops to control the gain of one of the two amplifiers.

6 Claims, 1 Drawing Figure

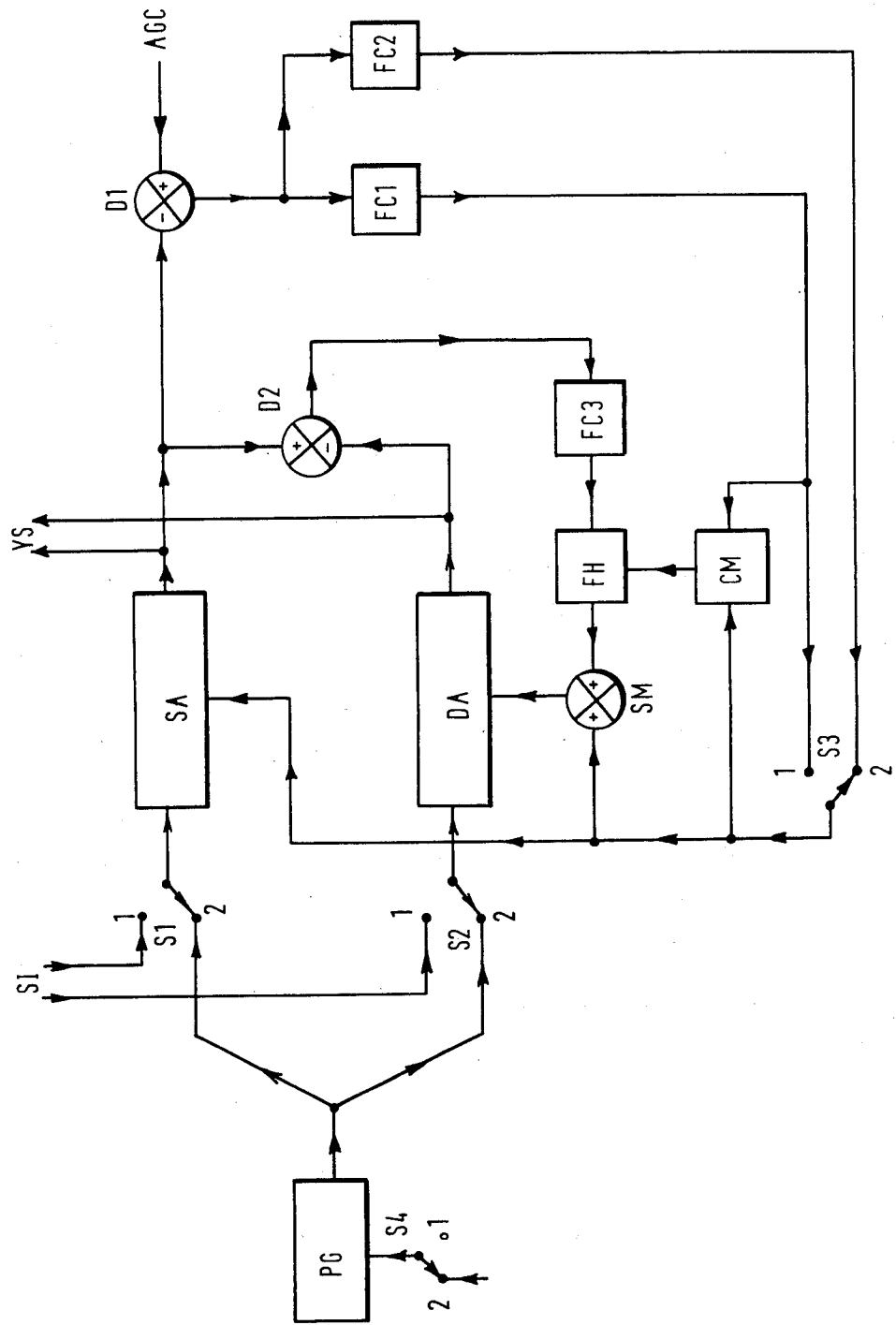

GAIN CONTROLLED AMPLIFIER CIRCUITS

THIS INVENTION relates to gain-controlled amplifier circuits, and in particular to the gain matching of pairs of such amplifiers.

Gain-matched pairs of gain-controlled amplifiers have their main application in monopulse radar receivers, though they may also be used in interferometry, direction-finding, or other applications. The description which follows will therefore be concerned with the monopulse radar application.

A monopulse radar receiver contains a pair of variable-gain amplifiers, commonly referred to as the "sum" and "difference" amplifiers, which are required to have closely-matched gains over a very wide gain range, perhaps of the order of 90 dB. Gain control of the two amplifiers is effected by means of an external automatic gain control reference signal. This is compared with the output of one of the two amplifiers and the error signal is used to control the gain of each of the two amplifiers. It has to be assumed that the gains of the two amplifiers are equal, since they cannot, with this arrangement, be controlled independently. Since the application requires the two amplifiers to be matched to within about 0.5 dB, considerable constraints are placed on the system. This is because in practice the gains of the two amplifiers may vary due to temperature and other effects.

It is an object of the invention to provide a gain-controlled amplifier circuit in which the gains of two such amplifiers may be closely matched at all times.

According to the present invention a gain-controlled amplifier circuit comprises a pair of gain-controlled amplifiers, tone generating means operable to apply to each amplifier during a correction time interval a pilot tone of equal amplitude in the form of an exponentially-decaying periodic signal of suitable frequency, an automatic gain control loop comprising means for subtracting the output of one amplifier from a reference gain control signal to derive a first error signal and means for applying a modified first error signal to the gain control inputs of the two amplifiers at times other than during a correction time interval, a correction loop comprising means for applying a compensated first error signal to the gain control inputs of the two amplifiers during each correction time interval, an amplifier gain control loop comprising means for subtracting the outputs of the two amplifiers to derive a second error signal, storage means for holding a corrected second error signal and means for applying the stored signal to the gain control input of the other amplifier in combination with the modified first error signal or the compensated first error signal as the case may be, and control means operable to allow the signal held by the storage means to change to the current value of the corrected second error signal only during that part of a correction time interval during which the compensated first error signal is greater than the modified first error signal.

Where the two amplifiers are the sum and difference amplifiers of a monopulse radar receiver, the correction time interval is the time interval between the receipt of the last echos resulting from a transmitted pulse and the following transmitted pulse.

An embodiment of the invention will now be described with reference to the accompanying drawings which shows a schematic block diagram of an amplifier circuit.

Referring now to the drawing, this shows the gain-controlled amplifier circuit for a monopulse radar. The main features of the circuit are the two amplifiers SA and DA. These are respectively the "sum" and "difference" intermediate-frequency amplifiers and detectors of a conventional monopulse radar. Each receives a signal input SI from the preceding circuitry of the receiver. These inputs are connected to the sum and difference amplifiers through switches S1 and S2 respectively. The outputs of the amplifiers form the normal video signals VS of such a radar. As in a conventional monopulse radar circuit an automatic gain control (AGC) loop is provided. In this the output of the sum amplifier SA is applied to a difference circuit D1 and is subtracted from a gain control signal AGC. The output of the difference circuit D1, referred to as the first error signal, passes through a conventional a.g.c. filter FC1 which has a long time-constant relative to the radar cycle time. The output of this filter is applied, through a switch S3, to the gain control inputs of the two amplifiers. Apart from the inclusion of the switch S3, this is a conventional a.g.c. loop.

As already stated, the signal input SI to the two amplifiers is applied through switches S1 and S2. In their alternative positions the switches apply to the two amplifiers pilot signals of equal amplitude generated by a pilot signal generator PG. This generates a signal in the form of an exponentially-decaying periodic signal. The periodic signal may be of square or sinusoidal form and should have a frequency within the pass-band of the two amplifiers, preferably around the centre frequency. In mathematical terms the pilot signal has a form expressed by the formula $\text{Exp}(jw-\sigma)t$. In general, it is a property of the exponentially-decaying envelope of the form $\text{Exp}(-\sigma t)$ that the amplitude expressed in decibels is proportional to time $t$ with a proportionality factor of $20 \log_{10} e/\text{time constant}$, where the time constant is $1/\sigma$. Hence a 90 dB dynamic range is obtained in a time of $90/8.686 \times 1/\sigma$ seconds (since $20 \log_{10} e = -8.686$). If, for example, $1/\sigma = 10 \, \mu S$, then the waveform decays at a rate of $0.8686 \, dB/\mu S$, and the full dynamic range is covered in a time of $103.62 \, \mu S$. The pulse generator may take the form of a delay line in which reflections are allowed to occur, thus causing the output to decay exponentially.

Returning to the drawing, the generator PG is itself triggered when a trigger pulse is applied by way of switch S4.

The circuit includes a correction loop in which the first error signal, obtained from the difference circuit D1, is applied through a compensating network FC2 to the alternate position of switch S3, so that at the appropriate time it may be applied to the gain control inputs of the two amplifiers.

A third control loop, the amplifier gain control loop, compares the gains of the two amplifiers. The amplifier outputs are applied to a difference circuit D2 which derives an error signal, referred to as the second error signal, which represents any differences in amplifier gain when equal inputs are applied. The second error signal passes through a correction network FC3 to a "follow and hold" circuit FH. This latter circuit is controlled by a control input and operates to follow the value of the corrected second error signal when the control input is present. When the control input is removed the last value of the corrected second error signal is retained. The output of the follow and hold circuit FH is combined by a summator SM with the gain control input applied to the difference amplifier DA.

The compensating network FC2 and correction network FC3 are of a type commonly used in servo system practice, basically for phase shift correction.

The control input to the follow and hold circuit FH is provided by a comparator CM. One input of the comparator is represented by the signal applied, at any instant, to the gain control input of the sum amplifier SA. The second input is the modified first error signal as obtained from the a.g.c. filter FC1.

The four switches S1 to S4 are controlled by means, not shown, which ensures that each is in position 1 when the radar is tracking, and in position 2 during the radar dead-time, that is during the correction time interval. The comparator CM is arranged to deliver an output only when the signal applied to the gain control input of the sum amplifier SA is greater than the signal in the a.g.c. loop. During tracking, with switch S3 in position 1, the two inputs to the comparator CM will obviously be the same, and hence no control signal is produced.

At the beginning of the radar dead-time, that is at the start of a correction time interval, all switches are moved to position 2. Switch S4 thus initiates the generation of the exponentially-decaying pilot signal which is applied at equal amplitudes to the two amplifiers. The time constant of the a.g.c. loop is such that the output of filter FC1 will not change significantly during the application of the pilot tone. The correction loop will respond, however, to any difference between the a.g.c. reference signal AGC and the output of the sum amplifier SA. The compensated first error signal in this loop is thus applied directly to the gain control input of the sum amplifier. In addition this signal is combined with the signal level held by the follow and hold circuit FH and applied to the gain control input of the difference amplifier.

At all times during the correction cycle a signal indicating the sense and magnitude of the gain error between amplifiers SA and DA is present at the output of the difference circuit D2. This output is fed back by way of the correction network FC3 and the follow and hold circuit FH to modify the gain of amplifier DA. This feedback loop equalises the gains of the two amplifiers. At the same time the error signal developed by difference circuit D1, and representing the difference between the output of amplifier SA and the AGC reference signal, is fed back by way of the compensating network FC2 to modify the gain of amplifier SA to reduce this error signal to zero.

As the pilot tone decays in amplitude the gains of amplifiers SA and DA start at a low value determined by the maximum pilot tone amplitude, and increase at a rate of 8.686 dB per time constant. This continues until either the pilot tone has decayed below the thermal noise level, or the amplifier is operating at maximum gain. At some point in this gain excursion the gain of amplifier SA will pass through the value which it held during the previous target tracking phase. This instant is detected by the comparator CM which compares the output of the long time-constant a.g.c. filter FC1 and the output of the compensating network FC2. At this point the comparator CM triggers the follow and hold circuit FH into the hold condition, thus retaining the value of the correction present at the output of the correction network FC3. This correction is subsequently applied as part of the control signal to amplifier DA during the next target tracking phase, and is the correction necessary to equalise the gains of the two amplifiers SA and DA for an input signal level equal to the target signal level.

At the end of the dead time, switches S1 to S4 revert to position 1, and the circuit is restored to the state required for tracking.

The circuit described above enables the relative gains of the two amplifiers to be controlled as well as the overall gain of each amplifier, and hence overcomes the problems associated with the conventional a.g.c. control loop. An additional advantage is that the characteristics of the two amplifiers need not be so closely matched, since their gains are independently controllable. This enables cheaper amplifiers to be used.

An additional advantage of the circuit described above is that the time interval between the start of the correction cycle and the equality detected by comparator CM is a direct measure of the signal-to-noise ratio of the target signal being tracked. This signal-to-noise ratio is given by the initial signal-to-noise ratio at the start of the exponential pilot tone decreased by 8.686 dB for each time-constant unit of time which passes up to the detection of the state of equality. Hence if the initial value of the pilot tone and its time constant are known, a simple time measurement during the correction phase gives an absolute value of the signal-to-noise ratio of the target signal.

What is claimed is:

1. A gain-controlled amplifier circuit having three distinct feedback loops which comprises a pair of gain-controlled amplifiers, tone generating means operable to apply to each amplifier during a correction time interval a pilot tone of equal amplitude in the form of an exponentially-decaying periodic signal of suitable frequency, a first of the feedback loops being an automatic gain control loop comprising means for subtracting the output of one amplifier from a reference gain control signal to derive a first error signal and modifying that signal and means for applying the modified first error signal to the gain control inputs of the two amplifiers at times other than during a correction time interval a second of the feedback loops being a correction loop providing a compensated first error signal comprising means for applying the compensated first error signal to the gain control inputs of the two amplifiers during each correction time interval, a third of the feedback loops being an amplifier gain control loop providing a second error signal by subtracting the outputs of the two amplifiers to derive the second error signal, storage means for holding a corrected second error signal and means for applying the stored signal to the gain control input of the other amplifier in combination with the modified first error signal of the compensated first error signal, and control means operable to allow the signal held by the storage means to change to the current value of the corrected second error signal only during that part of a correction time interval during which the compensated first error signal is greater than the modified first error signal.

2. A circuit as claimed in claim 1 in which the control means include a comparator operable to compare, during the correction time interval, the values of the modified first error signal and the compensated first error signal and to deliver an output signal only when the compensated first error signal is greater than the modified first error signal.

3. A circuit as claimed in claim 2 in which the storage means comprise a follow and hold circuit operable to follow the value of the corrected second error signal during the presence of an output signal from the comparator.

4. A circuit as claimed in claim 1 in which the frequency of the pilot tone is within the pass-band of the two gain-controlled amplifiers.

5. A circuit as claimed in claim 4 in which the frequency of the pilot tone is the nominal centre frequency of the two amplifiers.

6. A circuit as claimed in claim 4 in which the pilot tone is of sinusoidal form.

* * * * *